(12) United States Patent
Haase et al.

(10) Patent No.: US 6,967,499 B1
(45) Date of Patent: Nov. 22, 2005

(54) DUAL RAMP RATE DIELECTRIC BREAKDOWN TESTING METHODOLOGY

(75) Inventors: Gaddi S. Haase, Plano, TX (US); Joe W. McPherson, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/986,679

(22) Filed: Nov. 12, 2004

Related U.S. Application Data

(60) Provisional application No. 60/581,863, filed on Jun. 21, 2004.

(51) Int. Cl.[7] ............................................. G01R 31/26
(52) U.S. Cl. ........................ 324/766; 324/719; 438/17
(58) Field of Search ............................. 324/719, 158.1, 324/715, 763, 765, 766, 537; 438/17, 10; 702/57–58, 702/108

(56) References Cited

U.S. PATENT DOCUMENTS

| | | | |
|---|---|---|---|
| 4,144,493 A | * | 3/1979 | Lee et al. .................... 324/765 |
| 6,509,202 B1 | * | 1/2003 | Kim ............................ 438/17 |
| 6,603,321 B2 | * | 8/2003 | Filippi et al. ................ 324/719 |
| 6,617,179 B1 | * | 9/2003 | Kim ............................ 438/17 |

* cited by examiner

*Primary Examiner*—Paresh Patel
(74) *Attorney, Agent, or Firm*—Peter K. McLarty; W. James Brady, III; Frederick J. Telecky, Jr.

(57) ABSTRACT

The present invention provides, in one aspect, a method of testing an electrical breakdown characteristic of a dielectric in a microelectronic device. This method includes determining a first dielectric breakdown voltage distribution of a first test sample by using a first voltage ramp rate, determining a second dielectric breakdown voltage distribution of a second test sample by using a second voltage ramp rate and determining a spacing distribution between conductive lines in the first and second test samples based on a field acceleration factor associated with the dielectrics of the first and second test samples, the first and second voltage ramp rates, and a difference between the first and second breakdown voltage distributions. This spacing distribution is used to determine corrected electric breakdown fields based on a measured breakdown voltage of a test sample, to improve microelectronic-device screening for interconnect dielectric reliability.

20 Claims, 4 Drawing Sheets

DUAL RAMP RATE DIELECTRIC BREAKDOWN TESTING METHODOLOGY

CROSS-REFERENCE TO PROVISIONAL APPLICATION

This application claims the benefit of U.S. Provisional Application No. 60/581,863 entitled "DUAL-RAMP-RATE DIELECTRIC-BREAKDOWN TESTING METHODOLOGY," to Gaddi S. Haase, et al., filed on Jun. 21, 2004, which is commonly assigned with the present invention and incorporated herein by reference as if reproduced herein in its entirety.

TECHNICAL FIELD OF THE INVENTION

The present invention is directed in general to a method of testing for dielectric breakdown and, more specifically, to a method of using a dual ramp rate to correct erroneous dielectric breakdown values that are in reality attributable to spacing variations within a microelectronics device.

BACKGROUND

As the interconnect system in the back-end of integrated circuit (IC) chips shrinks, going from one technology node to the next, the line-to-line spacing between conductive lines also continues to shrink. As such, the dielectric thickness between the lines has presently reached values on the order ranging from about 90 nm to about 110 nm. Due to the desire to lower the line-to-line capacitance to minimize the RC time response of the interconnect network, low-k materials have been introduced as inter-metal-dielectrics. However, these new insulators no longer have the dielectric-strength of pure dense amorphous silicon oxides; their lower density and the presence of weaker bonds (such as Si—C bonds) introduce charge traps, and can potentially host mobile ions, that aid early breakdown events under electrical stress. In addition, the necessity for the integration of additional dielectrics films as etch-stop layers, and diffusion barriers on top of the copper metal lines, gives rise to interfaces that span between the lines and open new channels for early breakdown.

Since the profile of the etched trenches is often adjusted for copper filling optimization, in the damascene process presently used by most of the integrated circuit industry, the line-to-line spacing becomes even narrower at the top of the lines. This gives rise to the occurrence of the higher electric field near the interface between the low-k dielectric material and the diffusion-barrier/etch-stop layer above it.

Near the end of the fabrication of the microelectronic device, a dielectric test is conducted to determine both the quality and reliability of the dielectric. Usually, this test involves determining the electrical breakdown field of the dielectric within the test devices. The most commonly used model to predict the time to breakdown ($t_{bd}$) for silica-based dielectrics under an electric field E, states that:

$$t_{bd} = A \cdot e^{\frac{\Delta H^*}{k_b T} \gamma \cdot E}, \tag{1}$$

where A is a constant, $\Delta H^*$ is the zero-field activation energy, $\gamma$ is the field-acceleration parameter (which may be associated with the $S_i$—O bond dipole moment that interacts with the electric field to lower the bond strength), $k_b$ is the Boltzmann constant, and T is the temperature in degrees Kelvin.

For a given temperature T, $\gamma(T)$ can typically be extracted from a series of time-dependent dielectric breakdown (TDDB) tests: A collection of devices under test (DUTs: capacitors, comb—comb or comb-serpent test structures), which are chosen to be uniformly distributed across the wafer, are stressed at a constant voltage and the time-to-breakdown distributions are recorded. By virtue of area scalability, these distributions should obey Weibull statistics. From the characteristic time-to-breakdown $t_{bd}(E)$, under various electric fields E, one can obtain the value of $\gamma$, and extrapolate the dielectric lifetime to operating voltage at any required confidence level.

Since TDDB tests are slow, one cannot test sufficient number of DUTs to obtain good enough statistics. Based on A. Berman paper (IEEE Proc. IRPS, 1981), one can ramp the voltage across a capacitor until breakdown. This test turns out to be a constant time measurement, where the voltage (or field) at which a breakdown occurs with that time window (which is dictated by the voltage ramp rate). The test does not allow the determination of $\gamma$, but is fast and allows testing a larger sample of DUTs.

However, given the reduced spacing between the conductive lines in today's microelectronic devices, the translation of an applied voltage to the actual electric-field experienced by the dielectric becomes very dependent on the exact minimum spacing between the conductive-lines. The spacing distribution would cause the measured breakdown voltages to be very wide, with many values appearing below the predefined allowed value, set by reliability and quality standards. Thus, in many instances, reliable devices are discarded as scrape although their dielectrics had no defects, thereby reducing device yield. This is highly undesirable given the cost of manufacture and the loss of potential profit.

Accordingly, what is needed in the art is an improved method determining dielectric reliability that does not suffer from the disadvantages associated with the processes discussed above.

SUMMARY OF INVENTION

To address the above-discussed deficiencies of the prior art, the present invention provides, in one embodiment, a method of testing an electrical breakdown characteristic of a dielectric in a microelectronic device. In this particular embodiment, the method includes determining a first dielectric breakdown voltage distribution of a first test sample by using a first voltage ramp rate, determining a second dielectric breakdown voltage distribution of a second test sample by using a second voltage ramp rate and determining a spacing distribution between conductive lines in the first and second test samples based on a field acceleration factor associated with the dielectrics of the first and second test samples, the first and second voltage ramp rates, and a difference between the first and second breakdown voltage distributions. This spacing distribution is used to determine a corrected electric breakdown field based on a measured breakdown voltage of a test sample.

In another embodiment, the present invention provides a method for improving microelectronic-device screening for interconnect dielectric reliability. In this aspect of the present invention, the method includes measuring an electrical breakdown field distribution of a dielectric of a control test sample having conductive lines thereon, wherein a variant spacing between the conductive lines causes an electrical breakdown field distribution of the control sample determined from the electrical breakdown voltage distribution to be erroneous. The method further comprises determining a first dielectric breakdown voltage distribution of a first test sample by using a first voltage ramp rate, determining a second dielectric breakdown voltage distribution of a second test sample by using a second voltage ramp rate. A spacing distribution between conductive lines in the first and second test samples is also determined based on a field acceleration factor associated with the dielectrics of the first and second test samples, the first and second voltage ramp rates, and a difference between the first and second breakdown voltage distributions. This spacing distribution is used to correct the erroneous electric breakdown distribution of the control test sample.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
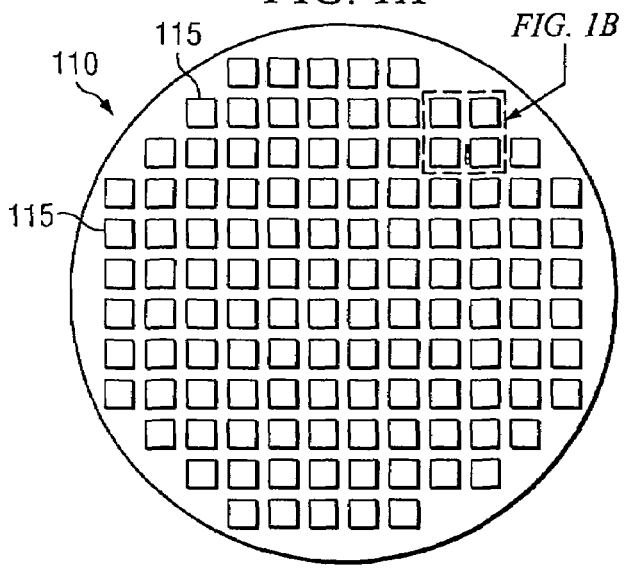
FIG. 1A illustrates an overhead view of a microelectronics wafer having test structures and die located thereon.
Figure 1B:
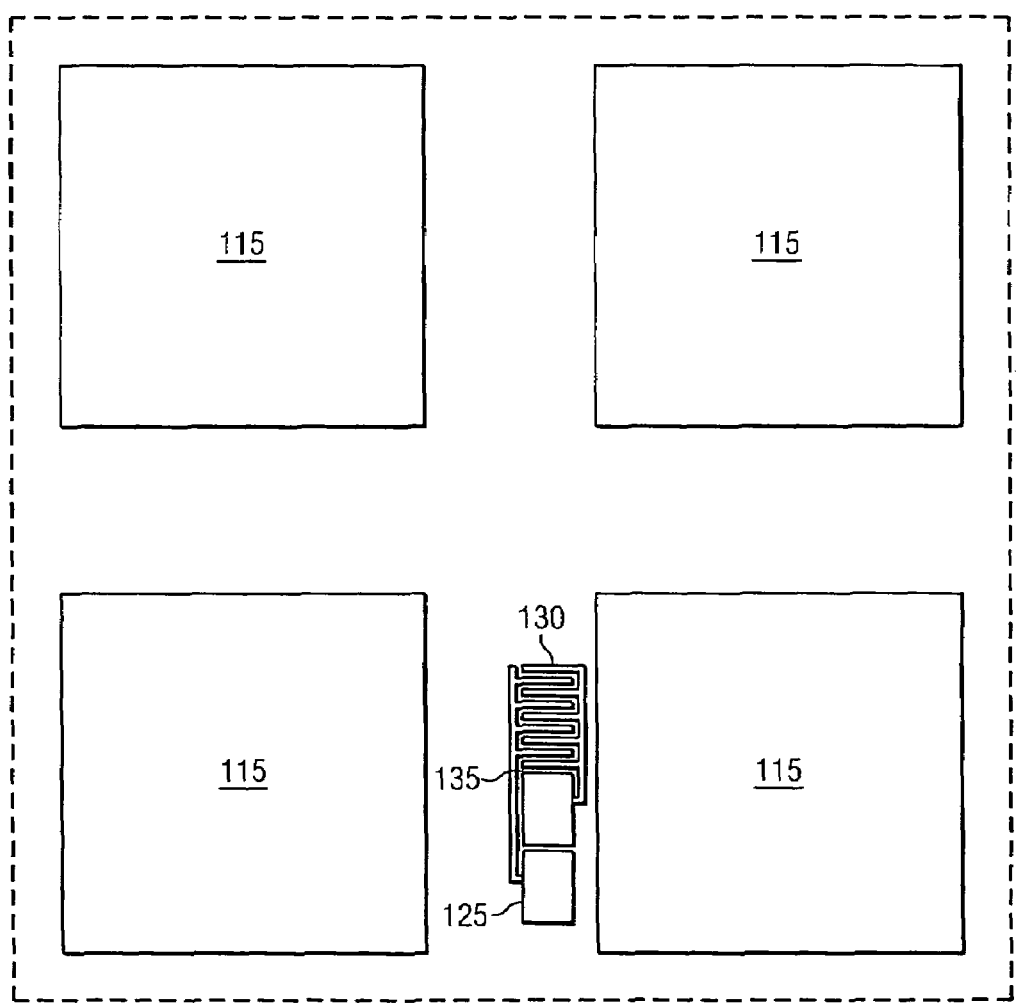
FIG. 1B illustrates an enlarged section of the microelectronics wafer of FIG. 1A.

Turning initially to FIG. 1A there is illustrated an overhead view of a wafer 110, such as a microelectronics wafer or a semiconductor wafer, having integrated circuit die 115 located, thereon, as shown in FIG. 1A and FIG. 1B which is a magnified view of a delineated portion of FIG. 1A, that contain conventional integrated circuits (not shown). Associated with at least one die 115, or group of die, is a test device 125, which is schematically shown and is enlarged for illustrative purposes only. The number of test devices 125 may vary, and each die 115 may have a test device 125 associated with it, or a group of die may have one test device 125 associated therewith, which is the case shown in FIG. 1B. A group of test devices 125 forms a test sample, and in advantageous embodiments, it is desirable to have the test sample as large and mixed as practical to get a good statistical sampling across the wafer 110. It should also be noted that in some embodiments, especially during development of a new technology, only the test devices 125 may be constructed on the wafer without any operative or product integrated circuits being located thereon. Also, sampling is preferably conducted on more than one wafer in order to get as large a statistical sampling as possible.

In an advantageous embodiment, the test devices 125 are substantially identical or similar comb structures or serpentine structures formed by conductive lines 130. In the current technology, the width of the conductive lines 130 may range from about 100 nm to about 140 nm and the distance separating the conductive lines 130 may range from about 80 nm to about 140 nm. However these dimensions are shrinking in every subsequent technology. The conductive lines 130 are separated and insulated from one another by a dielectric material 135, such as a dielectric having a low dielectric constant, also known as low-k dielectric material. Exemplary and well known low-k materials include, low-k polymer (possibly porous), aerogel, xerogel, spin-on glasses (such as HSQ, MSQ) or any other porous glass material. Other dielectric materials that can be utilized might include, FSG, PSG, BPSG, PETEOS, HDP oxide, silicon nitride, silicon oxynitride, doped or undoped silicon carbide, silicon carbo-oxy-nitride, or silicon dioxide. The dielecrics may also sometimes include high-k materials for various capacitor applications. The dielectric 135 and conductive materials used to construct the test devices 125 are preferably the same as those used to construct the individual integrated circuits located on the integrated circuit die 115. Also it is advantageous if all of the test devices 125 are substantially identical in structure, taking into account, of course, manufacturing variations from one test device 125 to the next.

Due to the continued reduction in the critical dimensions of the various structures within the integrated circuits located on the integrated circuit die 115, line separation is not guaranteed to be a constant distance, and as such, electrical variations can occur during the voltage breakdown testing procedures. All of the conventional methods described above assume that the line-to-line spacing ($S_i$) between different similar test devices 125 i, as well as within each test device 125, are well under control, or at least are subject to variations that are negligible in respect to the nominal spacing. However, at the 90 nm technology node and beyond, this is no longer true.

Figure 2:
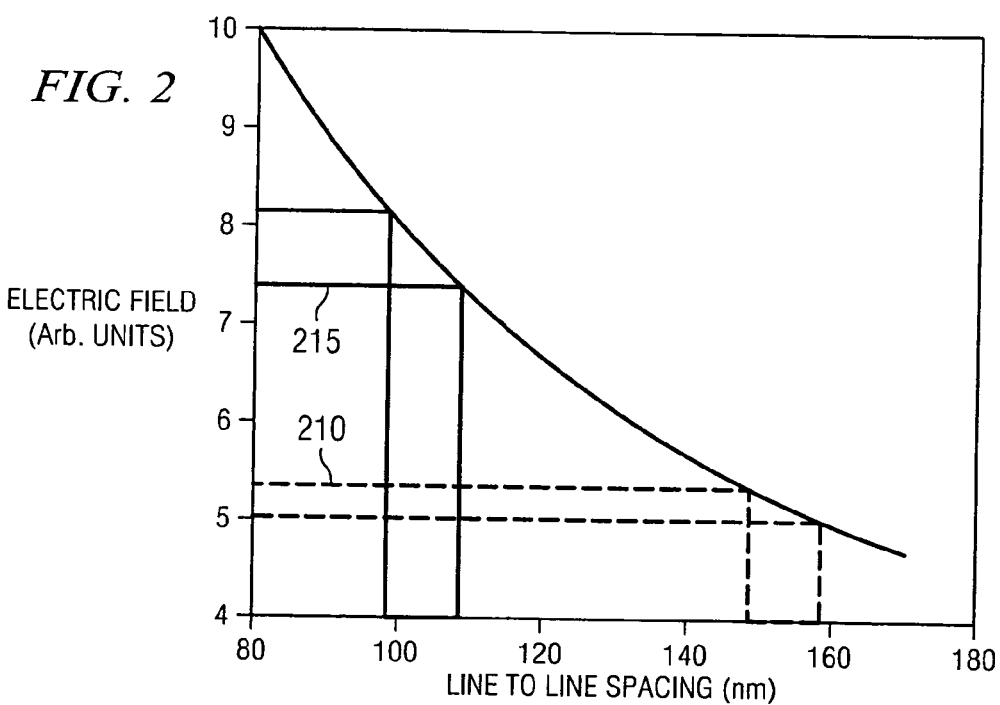
FIG. 2 is a graph illustrating how the electric field has increased as the line spacing between conductive lines as decreased.

FIG. 2 shows the difference between typical variations in the electric field due to the same spacing variations, for 130 nm technologies, designated by reference number 210, and 90 nm technologies, designated by reference number 215. The electrical field variation at the 90 nm technology 215 node becomes over 3 times higher for similar critical dimension (CD) fluctuations. As a result, voltage ramp (V-ramp) to breakdown gives a wider breakdown voltage ($V_{bd}$) distribution, which may be wrongly interpreted as a wider intrinsic dielectric strength variation. The latter would yield a lower predicted lifetime at the low acceptable failure rates that are specified for reliability engineers. Therefore, a true analysis of the interconnect dielectric reliability has to be able to correct the observed $V_{bd}(i)$ values for different, but similar, test devices 125 i according to the minimum-line-to-line-spacing $S_i$ within the test device 125. Note that time-dependent-dielectric-breakdown (TDDB) testing is even more problematic, since the long measurement periods limit the ability to obtain sufficient statistical sampling size, and the spacing fluctuations give rise to large errors in both the determination of the Weibull distribution parameters and the field acceleration parameter.

To measure the intrinsic dielectric breakdown parameters, the voltage across the dielectric for a population of test devices 125 can be conducted at two different ramp rates ($R_1$ and $R_2$, if the voltage ramp is continuous and R=dV/dt) or using the same $\Delta V$, but a different $\Delta \tau$time period per step. Similar dual ramp-rate experiments were used in the past to extract the field acceleration parameter or understand oxide defect distributions; however, dual ramp-rates have never been applied as provided by the present invention.

Ramping the stress voltage at two ramp-rates results in two different breakdown-voltage distributions: $V_{bd}(R_1, i)$ and $V_{bd}(R_2, i)$, where i represent a specific test device 125 with a minimum dielectric thickness, or line-to-line spacing, of $S_i$. We obtain for the two ramp rates:

$$I_{bd}(V_{op}) = t_0(R_1) \cdot e^{\frac{\gamma}{S_i} \cdot [V_{op} - V_{bd}(R_1, i)]} = t_0(R_2) \cdot e^{\frac{\gamma}{S_i} \cdot [V_{op} - V_{bd}(R_2, i)]}, \quad (5)$$

Where $t_0(R_i)$ is the Berman time-window associated with the ramp-rate $R_i$, and which after rearrangement yields:

$$[V_{bd}(R_2, i) - V_{bd}(R_1, i)] = \frac{S_i}{\gamma} \cdot \ln\left(\frac{R_2}{R_1}\right) \quad (6)$$

for a continuous ramp, or for a stepped ramp with the same $\Delta V$ per step:

$$[V_{bd}(R_2, i) - V_{bd}(R_1, i)] = \frac{S_i}{\gamma} \cdot \ln\left(\frac{\Delta \tau_1}{\Delta \tau_2}\right).$$

Obviously, one test device 125, i cannot be broken down more than once or at two different ramp rates. Thus, a large statistical sample must be taken for both ramp rates, and it is beneficial that the test device locations of the samples are very well mixed.

Figure 3:
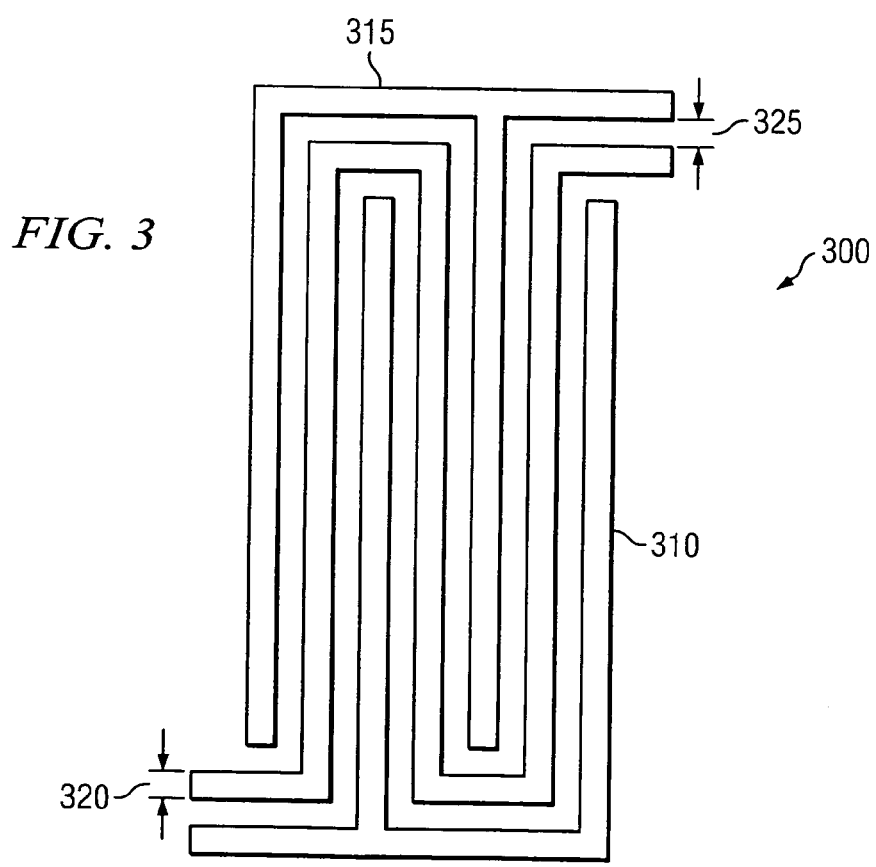
FIG. 3 in an overhead view of an example of a test device on which voltage breakdown measurement can be conducted.

Turning now to FIG. 3, there is illustrated an enlarged overhead view of a test device 300, which may also be referred to herein as a DUT 300 on which experimental Voltage-ramp to breakdown tests were conducted in accordance with the principles of the present invention. In the illustrated embodiment, the DUT 300 included a 33 cm long comb-serpent lower structure 310 and a 33 cm long upper structure 315, with nominal copper line widths 320 of about 140 nm and line-to-line spacing 325 of about 130 nm. The trenches for the copper lines were etched into organosilicate glass (OSG, k=~2.8) with a ~60 nm SiCN etch stop layer at the bottom. A Ta/TaN barrier was deposited prior to copper-seed deposition and electrochemical copper fill. For the metal levels studied, the top Copper surfaces, which were exposed after chemical mechanical polish (CMP), were covered with another ~60 nm SiCN as an etch stop layer for the next inter-metal level dielectric etch (a single Damascene processing scheme). The top-most metal level was covered with a SiN/SiO2 protective overcoat (PO) after a 400° C. bake in forming gas. The comb and serpent electrodes were contacted through vias and metal lines to Al pads in the moisture-proof PO encapsulation.

Stress and current measurements were employed using a computer-controlled Agilent 4156C semiconductor parameter analyzer. The wafers were tested in an S300 "Femtoguard" Cascade probe station, with a temperature-controlled chuck and under a dark hood.

Several of these DUTs 300 were fabricated on three separate wafers containing 32 shots, with each shot containing several replicas of the DUT 300. For every temperature, the voltage across the 32 DUTs 300 was ramped until breakdown occurred, using 100 mV/0.17 second steps, and 32 more DUTs 300 were ramped at 100 mV/1.770 second steps. In every instance, the DUT's 300 used for each ramp-rate were changed, so as to mix the DUTs thoroughly and prevent any effect of systematic within-shot CD variations.

Figure 4:
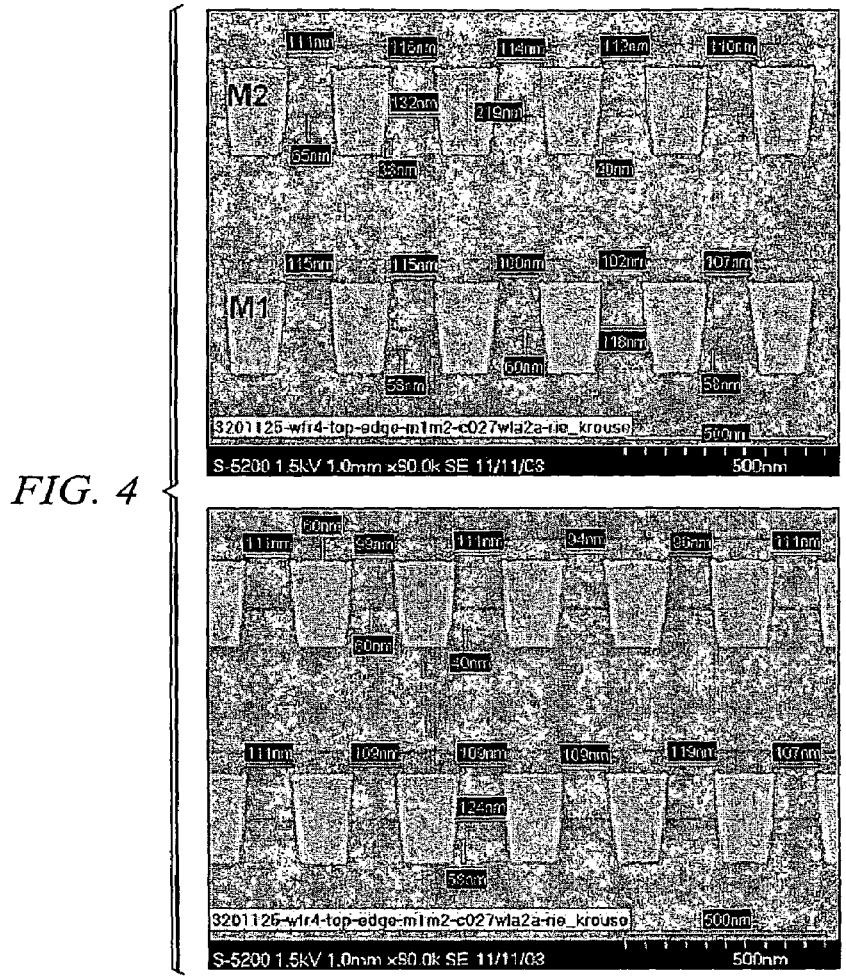
FIG. 4 is a sectional view of a scanning electron microscope photograph of a test device showing the line to line spacing variation.

Scanning electron microscopy of at least 25 locations per cross-sectioned DUT 300 for a few DUTs across a wafer revealed that the minimum line-to-line spacing at the top of a metal line, ranged from about 90 nm to about 110 nm. An example of such a cross-section for one DUT 300, and the distribution of the spacings between the top of adjacent lines, is shown in FIG. 4. As seen from the cross section of FIG. 4, the line to line spacing varied significantly, within the above stated range. Since the lines in these DUTs 300 are very long, the probability of imaging the true minimally spaced location is very small. Hence it was assumed that spacing as low as 85 nm could also be found along a test structure. From this figure it is easily seen that a constant line to line spacing cannot be assumed in microelectronic devices approaching the 130 nm to 90 nm range and below.

Figure 5:
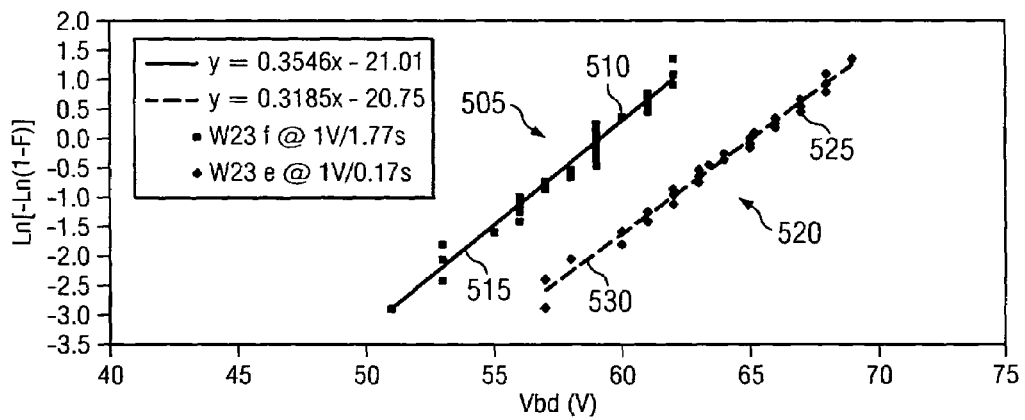
FIG. 5 is a plot of two distribution curves taken on separate testing samples and at two different ramp rates.

FIG. 5 is a graphical representation of a first dielectric breakdown voltage distribution 505 of a first test sample 510 by using a first voltage ramp rate, as indicated by the fitted line 515 and a second dielectric breakdown voltage distribution 520 of a second test sample 525 by using a second voltage ramp rate, as indicated by the fitted line 530. While each test sample could include only one or two test devices, it is preferable that each test sample 510 and 525 includes several of the individual test devices, as illustrated in FIG. 1. As previously stated, it is advantageous to get a large and well mixed sample such that the statistical probability is improved. As seen several from FIG. 5 voltage breakdown measurements were taken across both samples 510 and 525 and for several test devices, which are represented by the individual data plots on each of the distribution curves. It should be noted that, in this instance, the curves appear to converge as the voltage breakdown $V_{bd}$ decreases. In such instances, it has been found this convergence can be taken as an indication that the dielectric is not necessarily defective, but that the convergence is attributable to variations in line to line spacing between the conductive lines. In contrast, it has also been found that a divergence in the lines is an indication that the dielectric is defective for devices represented by the data in the divergent region. Thus, this provides a quick and easy readable tool to determine if a portion of the curve falling below specifications is in deed defective or is attributable only to line to line spacing variation.

Following the accumulation of the $V_{bd}$ data of each of the test samples, equation 6 above, can be algebraically rearranged as follows to obtain the minimum spacing distribution $S_i$ between the conductive lines:

$$S_i = \frac{[V_{bd}(i, R_1) - V_{bd}(i, R_2)] \cdot \gamma}{\ln\left(\frac{R_1}{R_2}\right)} i \qquad (7)$$

The field acceleration parameter $\gamma$ is usually in the range of 3 cm/MV to 5 cm/MV., and it can be assumed to be constant all across the wafer, since the material composition variation is <2%. If the breakdown voltages are indeed strongly affected by spacings $s_i$, there should be a clear correlation between the spacing values that are determined from comparing the sorted $V_{bd}(i)$ data. Thus, if $\gamma$ is known, from equation 7, $S_i$ can be determined from the measured breakdown-voltage, and the ramp rates are known. If $\gamma$ is not known, it can be evaluated on one wafer, for example, by fitting the $s_i$ distribution to the minimum-spacings that can be found through electron microscopy images of cross sections of many DUTs across the wafer. Since the same device test cannot be broken twice at two different ramp rates, it is preferable to fit a smooth line or curve through the $V_{bd}$ data, and use the smoothed values in eq. 7. The two curves in FIG. 5 give the cumulative distribution as a function of $S_i$ that is determined from the linear Weibull fits, and from the $2^{nd}$ order polynomial fits. Both curves show a very similar trend; there is a very clear correlation between the spacing and the breakdown voltage distributions, whereby $s_i$ decreases with decreasing $V_{bd}$, suggesting that the majority of the $V_{bd}$ distribution width indeed stems from CD variations and not from a defective dielectric.

Figure 6:
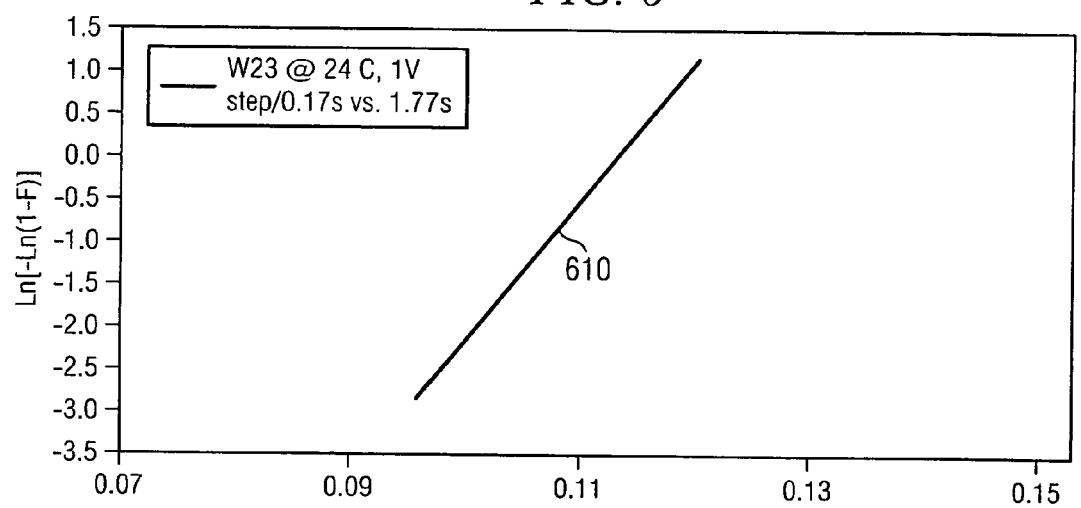
FIG. 6 is a plot of a calculated line to line spacing of the distribution curves of FIG. 5 as determined by using equation 7, as set forth below.

Referring now to FIG. 6, there is illustrated a distribution curve 610 of a calculated line spacing in $S_i$ as a function of the probability obtained from the application of equation 7 to the $V_{bd}$ data obtained from the first or second test samples of FIG. 5. This data can be used to correct the electrical breakdown field data, which can be determined from the breakdown voltage distributions, for erroneous data that results from line spacing variation and not from actual dielectric failure.

Figure 7:
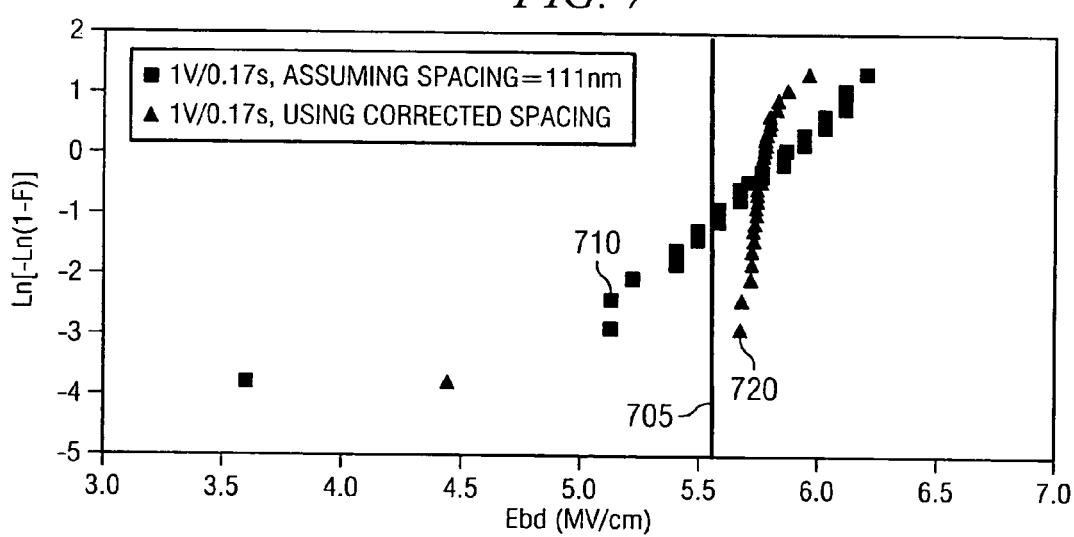
FIG. 7 illustrates an uncorrected distribution curve of electrical breakdown field of one of the distribution curves of FIG. 5 and illustrates a corrected distribution curve of that same data.

FIG. 7 illustrates two distribution curves of electrical breakdown field data shown relative to a specification line 705. For purposes of discussion here, the specification line 705 is a cut-off line that demarcates the point at which a product is accepted or rejected. In this illustration, all points to the left of the specification line 705 would related to product considered to be out of specification and would be scrapped, and all points to the right of the specification line 705 would represent product considered to be within specification and would not be scrapped. Curve 710 represents dielectric electric breakdown field measurements of the same test sample used to obtain distribution curve 520, as shown in FIG. 5, or in another embodiment, it may also be a control sample of similar construction as the test devices that also has variations in the spacing between its conductive lines. As seen from the distribution curve 710, the electrical breakdown field for several of the devices falls to the left of the specification line 705, and would, under normal circumstances be considered to be out of specification. In contrast, distribution curve 720 represents a corrected distribution of distribution curve 710 after using the data illustrated in FIG. 6 to correct distribution curve 710. As seen, after correcting for the erroneous electrical breakdown field resulting from the varied spacing, a substantial number of the points that were once considered to be out of specification are now pulled to the right of the specification line 705. Thus, a substantial number of devices that would have otherwise have been scrapped are now shown to be well within specification.

One who is skilled in the art would understand how to develop a correction algorithm that would appropriately apply each data point of FIG. 6 to each data point of distribution curve 520 of FIG. 5 to arrive at the corrected breakdown-field distribution curve 720. The breakdown field $E_{bd}(i, R)$, at which the dielectric experienced an electric breakdown within the Berman time window to (R) can be taken as:

$$E_{bd}(i, R) = \frac{V_{bd}(i, R)}{S_i}. \qquad (8)$$

The present invention, therefore, provides a relatively quick and easy method for improving microelectronic-device screening for interconnect dielectric reliability. This convenient method can be used to determine whether an out-of-specification dielectric breakdown value of a product is indeed attributable to the failure of an unreliable dielectric or is attributable, instead, to only line to line spacing variation. The former product, of course, would be scrapped as defective product, while the latter would be kept, thereby increasing yields and avoiding the unnecessary scrapping of good product.

Although the present invention has been described in detail, one who is of ordinary skill in the art should understand that they can make various changes, substitutions, and alterations herein without departing from the scope of the invention.

What is claimed is:

1. A method of testing an electrical breakdown characteristic of a dielectric in a microelectronic device, comprising:
   determining a first dielectric breakdown voltage distribution of a first test sample by using a first voltage ramp rate;
   determining a second dielectric breakdown voltage distribution of a second test sample by using a second voltage ramp rate;
   determining a spacing distribution between conductive lines in the first and second test samples based on a field acceleration factor associated with the dielectrics of the first and second test samples, the first and second voltage ramp rates, and a difference between the first and second breakdown voltage distributions; and
   using the spacing distribution to determine an electrical breakdown field of a dielectric of the microelectronic device.

2. The method as recited in claim 1, wherein the spacing distribution is determined by using:

$$V_{bd}(i, R_1) - V_{bd}(i, R_2) = \frac{S_i}{\gamma} \cdot \ln\left(\frac{R_1}{R_2}\right),$$

wherein $R_1$ is the first ramp rate, $R_2$ is the second ramp rate, $S_i$ is the spacing distribution and $\gamma$ is the field acceleration factor.

3. The method as recited in claim 2 wherein $\gamma$ ranges from about 3.8 cm/MV to about 4.5 cm/MV for a silica based dielectric material.

4. The method as recited in claim 1, wherein the first and second test samples are located on a semiconductor wafer adjacent respective integrated circuit dies, with each die including a dielectric material included in the first or second test samples.

5. The method as recited in claim 1 wherein the dielectric layers of the first and second test samples and the semiconductor dielectric comprises a low-k dielectric.

6. The method as recited in claim 1 wherein the first test sample includes a plurality of first test devices and determining a first breakdown voltage distribution includes determining the breakdown voltage of each of the plurality of first test devices, and wherein the second test sample includes a plurality of second test devices and determining a second breakdown voltage distribution includes determining the breakdown voltage of each of the a plurality of second test devices.

7. The method as recited in claim 1 wherein the first and second test samples include a plurality of conductive comb or serpentine test structures.

8. The method as recited in claim 1 wherein determining the spacing distribution includes determining the spacing between conductive lines of a plurality of test structures within each of the first and second test samples.

9. The method as recited in claim 1 wherein the test sample is either the first or second test samples.

10. The method as recited in claim 9 wherein a constant spacing between conductive lines is used to determine the electrical breakdown field of either the first or second test samples.

11. A method for improving microelectronic-device screening for interconnect dielectric reliability, comprising:
measuring an electrical breakdown voltage distribution of a dielectric of a control test sample having conductive lines thereon, wherein a variant spacing between the conductive lines causes an electrical breakdown field distribution of the control sample determined from the electrical breakdown voltage distribution to be erroneous;
determining a first dielectric breakdown voltage distribution of a first test sample by using a first voltage ramp rate;
determining a second dielectric breakdown voltage distribution of a second test sample by using a second voltage ramp rate;
determining a spacing distribution between conductive lines in the first and second test samples based on a field acceleration factor associated with the dielectrics of the first and second test samples, the first and second voltage ramp rates, and a difference between the first and second breakdown voltage distributions; and
using the spacing distribution to correct the erroneous electric breakdown field distribution.

12. The method as recited in claim 11, wherein the spacing distribution is determined by using:

$$V_{bd}(i, R_1) - V_{bd}(i, R_2) = \frac{S_i}{\gamma} \cdot \ln\left(\frac{R_1}{R_2}\right),$$

wherein $R_1$ is the first ramp rate, $R_2$ is the second ramp rate, $S_i$ is the spacing distribution and $\gamma$ is the field acceleration factor.

13. The method as recited in claim 12 wherein $\gamma$ ranges from about 3.8 cm/MV to about 4.5 cm/MV for a silica based dielectric material.

14. The method as recited in claim 11, wherein the control test sample and the first and second test samples are located on a semiconductor wafer adjacent respective integrated circuit dies, with each die including a dielectric material included in the control test sample, or the first or second test samples.

15. The method as recited in claim 11 wherein the dielectric of the control test sample and the first and second test samples comprise a low-k dielectric.

16. The method as recited in claim 11 wherein the control test sample includes a plurality of control test devices and measuring the electrical breakdown field distribution includes measuring an electrical breakdown field of each control test device, and wherein the first test sample includes a plurality of first test devices and determining a first breakdown voltage distribution includes determining the breakdown voltage of each of the plurality of first test devices, and wherein the second test sample includes a plurality of second test devices and determining a second breakdown voltage distribution includes determining the breakdown voltage of each of the a plurality of second test devices.

17. The method as recited in claim 11 wherein the control test sample and the first and second test samples include a plurality of conductive comb or serpentine test structures.

18. The method as recited in claim 11 wherein determining the spacing distribution includes determining the spacing between conductive lines of a plurality of test devices within each of the first and second test samples.

19. The method as recited in claim 1 wherein the control test sample is either the first test sample or second test sample.

20. The method as recited in claim 19 wherein a spacing between conductive lines is assumed to be a constant spacing, and the constant spacing is used to determine the electrical breakdown field distribution of the control test sample.

* * * * *